(12) United States Patent
Jung et al.

(10) Patent No.: US 11,514,842 B2
(45) Date of Patent: Nov. 29, 2022

(54) LED BASED DISPLAY PANEL INCLUDING COMMON LED DRIVING CIRCUIT AND DISPLAY APPARATUS INCLUDING THE SAME

(71) Applicant: SAMSUNG ELECTRONICS CO., LTD., Suwon-si (KR)

(72) Inventors: Youngki Jung, Suwon-si (KR); Tetsuya Shigeta, Suwon-si (KR); Jinho Kim, Suwon-si (KR); Chulgyu Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/166,683

(22) Filed: Feb. 3, 2021

(65) Prior Publication Data

US 2021/0241682 A1 Aug. 5, 2021

(30) Foreign Application Priority Data

Feb. 5, 2020 (KR) .......................... 10-2020-0013979

(51) Int. Cl.
*G09G 3/32* (2016.01)
*H01L 27/15* (2006.01)

(52) U.S. Cl.
CPC ............. *G09G 3/32* (2013.01); *H01L 27/156* (2013.01); *G09G 2310/0275* (2013.01)

(58) Field of Classification Search
CPC ......... G09G 3/3266; G09G 2300/0861; G09G 2300/0819; G09G 2300/0426;
(Continued)

(56) References Cited

U.S. PATENT DOCUMENTS 7,167,169 B2 1/2007 Libsch et al.
10,636,353 B2 4/2020 Miyasaka et al.
(Continued)

FOREIGN PATENT DOCUMENTS

JP 2019-117266 A 7/2019
KR 10-2014-0030455 A 3/2014
(Continued)

OTHER PUBLICATIONS

International Search Report (PCT/ISA/210) dated May 10, 2021 by the International Searching Authority in International Patent Application No. PCT/KR2021/001389.
(Continued)

*Primary Examiner* — Nitin Patel
*Assistant Examiner* — Amen W Bogale
(74) *Attorney, Agent, or Firm* — Sughrue Mion, PLLC

(57) ABSTRACT

A display panel is provided. The display panel includes a plurality of light-emitting diodes constituting a plurality of sub-pixels of the display panel and configured to be divided into a plurality of groups; and a plurality of LED driving circuits configured to: receive a PWM data voltage in a scanning period; and based on the PWM data voltage, drive the plurality of light-emitting diodes by providing drive current to the plurality of light-emitting diodes for a time corresponding to the PWM data voltage in an emission period, wherein each of the plurality of LED driving circuits is configured to be connected to light-emitting diodes included in respective groups of the plurality of groups, and drive the light-emitting diodes of the respective groups.

13 Claims, 14 Drawing Sheets

(58) Field of Classification Search
CPC ... G09G 2300/0465; G09G 2300/0852; G09G 2310/021; G09G 2310/0262; G09G 2310/0218; G09G 2330/021; G09G 3/32; G09G 3/2022; G09G 3/3225; G09G 3/2003; G09G 3/3258; G09G 3/2018; G09G 3/2025; G09G 3/3233; G09G 3/3275; G09G 2300/0439; G09G 2300/0809; G09G 2300/0443; G09G 2300/0452; G09G 2300/0804; G09G 2300/0842; G09G 2310/0221; G09G 2310/0235; G09G 2310/0264; G09G 2310/0278; G09G 2310/0275; G09G 2310/0224; G09G 2310/0205; G09G 5/02; G09G 2320/064; G09G 2320/0646; H01L 25/075; H01L 25/0753; H01L 25/167

See application file for complete search history.

(56) References Cited

U.S. PATENT DOCUMENTS

| | | | |
|---|---|---|---|
| 10,803,789 B1* | 10/2020 | Watsuda | H01L 27/1255 |
| 10,825,380 B2 | 11/2020 | Kim et al. | |
| 10,902,818 B2 | 1/2021 | Kim et al. | |
| 2005/0264497 A1* | 12/2005 | Shin | G09G 3/3233 345/76 |
| 2014/0062988 A1 | 3/2014 | Lee et al. | |
| 2015/0041790 A1* | 2/2015 | Lee | H01L 27/322 257/40 |
| 2016/0307510 A1* | 10/2016 | Duan | G09G 3/32 |
| 2017/0229056 A1* | 8/2017 | Li | G09G 3/3233 |
| 2018/0174504 A1 | 6/2018 | Yoneoka et al. | |
| 2018/0182279 A1 | 6/2018 | Sakariya et al. | |
| 2019/0325806 A1 | 10/2019 | Hashimoto | |
| 2019/0371231 A1 | 12/2019 | Kim et al. | |
| 2020/0020296 A1 | 1/2020 | Kim et al. | |
| 2020/0135092 A1* | 4/2020 | Ahmed | G09G 3/32 |
| 2020/0312232 A1* | 10/2020 | Yen | G09G 3/32 |
| 2020/0357332 A1* | 11/2020 | Hung | G09G 3/3233 |
| 2021/0082337 A1 | 3/2021 | Asamura | |
| 2021/0217352 A1* | 7/2021 | Xuan | G09G 3/32 |

FOREIGN PATENT DOCUMENTS

| | | |
|---|---|---|
| KR | 10-2015-0017071 A | 2/2015 |
| KR | 10-2018-0011397 A | 2/2018 |
| KR | 10-2019-0004608 A | 1/2019 |
| KR | 10-2019-0136882 A | 12/2019 |
| KR | 10-2058707 B1 | 12/2019 |
| KR | 10-2020-0007318 A | 1/2020 |
| KR | 10-2020-0115003 A | 10/2020 |
| KR | 10-2165446 B1 | 10/2020 |
| WO | 2019/049359 A1 | 3/2019 |

OTHER PUBLICATIONS

Written Opinion (PCT/ISA/237) dated May 10, 2021 by the International Searching Authority in International Patent Application No. PCT/KR2021/001389.

* cited by examiner

LED BASED DISPLAY PANEL INCLUDING COMMON LED DRIVING CIRCUIT AND DISPLAY APPARATUS INCLUDING THE SAME

CROSS-REFERENCE TO RELATED APPLICATION

This application is based on and claims priority under 35 U.S.C. § 119(a) to Korean Patent Application No. 10-2020-0013979, filed on Feb. 5, 2020 in the Korean Intellectual Property Office, the disclosure of which is incorporated by reference herein in its entirety.

BACKGROUND

1. Field

The disclosure relates to a light-emitting diode-based display panel and a display apparatus including the same. More specifically, the display apparatus relates to a connection and operation of a light-emitting diode (LED) driving circuit for driving the LED constituting a sub-pixel.

2. Description of Related Art

A pulse amplitude modulation (PAM) that expresses a grayscale (or gradation) with a difference in voltage applied to a light-emitting diode and/or a pulse width modulation (PWM) that expresses the grayscale with a difference in time when voltage is applied to the light-emitting diode have been used as a method of adjusting the grayscale of light-emitting diodes in the related art display panel.

For example, in the related art display panel, when driving a plurality of light-emitting diodes in a plurality of rows in the PWM method, PWM data is input to a plurality of LED driving circuits corresponding to each of the plurality of light-emitting diodes, and the plurality of the light-emitting diodes are driven based on the input PWM data.

However, there is a problem in that instantaneous power supplied to the display apparatus increases as the light emission of the light-emitting diode is concentrated only in a specific period.

SUMMARY

Provided is a display panel in which instantaneous power and average power supplied to the display panel are reduced by dividing emission periods of a plurality of light-emitting diodes into groups.

Also provided is a display panel that reduces manufacturing cost and is advantageous in utilizing space of a panel by using one LED driving circuit to drive two or more light-emitting diodes.

Additional aspects will be set forth in part in the description which follows, and in part, will be apparent from the description, or may be learned by practice of the presented embodiments.

In accordance with an aspect of the disclosure, there is provided a display panel. The display panel includes a plurality of light-emitting diodes constituting a plurality of sub-pixels of the display panel and configured to be divided into a plurality of groups; and a plurality of LED driving circuits configured to: receive a PWM data voltage in a scanning period; and based on the PWM data voltage, drive the plurality of light-emitting diodes by providing drive current to the plurality of light-emitting diodes for a time corresponding to the PWM data voltage in an emission period, wherein each of the plurality of LED driving circuits is configured to be connected to light-emitting diodes included in respective groups of the plurality of groups, and drive the light-emitting diodes of the respective groups.

Each of the plurality of LED driving circuits are configured to drive the respective groups of the plurality of groups by driving the light-emitting diodes included in the respective groups through a scanning period and an emission period associated with each of the plurality of groups.

A first LED driving circuit among the plurality of LED driving circuits is configured to receive a first PWM data voltage for first light-emitting diodes included in a first group among the plurality of groups in a first scanning period associated with the first group, and drive the first light-emitting diodes included in the first group based on the first PWM data voltage in a first emission period associated with the first group, and a second LED driving circuit among the plurality of LED driving circuits is configured to receive a second PWM data voltage for second light-emitting diodes included in a second group among the plurality of groups in a second scanning period associated with the second group, and drive the second light-emitting diodes included in the second group based on the second PWM data voltage in a second emission period associated with the second group.

Each of the plurality of LED driving circuits is configured to be connected to a plurality of transistors in the respective groups of the plurality of groups, and the plurality of transistors include a first transistor included in the first group and connected to one of the first light-emitting diodes driven by the first LED driving circuit among the plurality of LED driving circuits and a second transistor included in the second group and connected to one of the second light-emitting diodes driven by the second LED driving circuit among the plurality of LED driving circuits.

Each of the LED driving circuits is configured to, based on the first PWM data voltage received in the first scanning period, turn on the first transistor according to a first control signal and provide the drive current to the first light-emitting diodes included in the first group through the first transistor during the first emission period, and each of the LED driving circuits is configured to, based on the second PWM data voltage received in the second scanning period, turn on the second transistor according to a second control signal and provide the drive current to the second light-emitting diodes included in the second group through the second transistor during the second emission period.

The plurality of light-emitting diodes are configured to constitute the plurality of sub-pixels of a plurality of pixels arranged in a matrix form on the display panel.

The plurality of light-emitting diodes are grouped into a plurality of rows.

The plurality of light-emitting diodes are grouped in a checkerboard form.

In accordance with an aspect of the disclosure, there is provided a method of operating a display panel including a plurality of light-emitting diodes constituting a plurality of sub-pixels. The method includes: receiving, by a plurality of LED driving circuits, a PWM data voltage in a scanning period; and based on the PWM data voltage, driving, by the plurality of LED driving circuits, the plurality of light-emitting diodes by providing driving current to the plurality of light-emitting diodes for a time corresponding to the PWM data voltage in an emission period. The plurality of light-emitting diodes are configured to be divided into a plurality of groups, and the plurality of LED driving circuits are configured to be connected to light-emitting diodes included in respective groups of the plurality of groups, and drive the light-emitting diodes of the respective groups.

The driving further includes driving the respective groups of the plurality of groups by driving the light-emitting diodes included the respective groups through a scanning period and an emission period associated with each of the plurality of groups.

The driving further includes receiving a first PWM data voltage for first light-emitting diodes included in a first group among the plurality of groups in a first scanning period associated with the first group, and driving the first light-emitting diodes included in the first group based on the first PWM data voltage in a first emission period associated with the first group, and receiving a second PWM data voltage for second light-emitting diodes included in a second group among the plurality of groups in a second scanning period associated with the second group, and driving the second light-emitting diodes included in the second group based on the second PWM data voltage in a second emission period associated with the second group.

Each of the plurality of LED driving circuits is configured to be connected to a plurality of transistors in the respective groups of the plurality of groups, and the plurality of transistors include a first transistor included in the first group and connected to one of the first light-emitting diodes driven by a first LED driving circuit among the plurality of LED driving circuits, and a second transistor included in the second group and connected to one of the second light-emitting diodes driven by a second LED driving circuit among the plurality of LED driving circuits.

The driving further includes: based on the first PWM data voltage received in the scanning period, turning on the first transistor according to a first control signal and providing the drive current to the first light-emitting diodes included in the first group through the first transistor during the first emission period, and based on the second PWM data voltage received in the second scanning period, turning on the second transistor according to a second control signal and providing the drive current to the second light-emitting diodes included in the second group through the second transistor during the second emission period.

The display panel according to one or more embodiments of the disclosure may reduce instantaneous power and average power consumed by the display apparatus, by dividing and driving two or more light-emitting diodes belonging to different groups through one LED driving circuit.

In addition, the display panel according to one or more embodiments of the disclosure may reduce manufacturing cost since the number of LED driving circuits for driving a plurality of light-emitting diodes in the display panel is reduced compared to that of the related art.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

In the following description, a detailed description of the related art or well-known functions may not be described in detail if they would obscure the gist of the disclosure with unnecessary details. In addition, redundant description of the embodiments will be omitted.

The terms used in the following description are provided to explain example embodiments and are not intended to limit the scope of the disclosure. Singular forms may include plural forms, unless the context clearly indicates otherwise.

Throughout the disclosure, it will be understood that the term "comprise" and variations thereof, such as "comprising" and "comprises", specify the presence of features, numbers, steps, operations, components, parts, or combinations thereof, but do not preclude the presence or addition of one or more other features, numbers, steps, operations, components, parts, or combinations thereof.

In the description, the terms "first, second, and so forth" are used to describe diverse elements regardless of their order and/or importance and to discriminate one element from other elements, but are not limited to the corresponding elements.

When an element (e.g., a first element) is "operatively or communicatively coupled with/to" or "connected to" another element (e.g., a second element), an element may be directly coupled with another element or may be coupled through the other element (e.g., a third element). On the other hand, when an element (e.g., a first element) is "directly coupled with/to" or "directly connected to" another element (e.g., a second element), an element (e.g., a third element) may not be between the first element and the second element.

Hereinafter, the disclosure will be described in detail with reference to the accompanying drawings.

Figure 1:
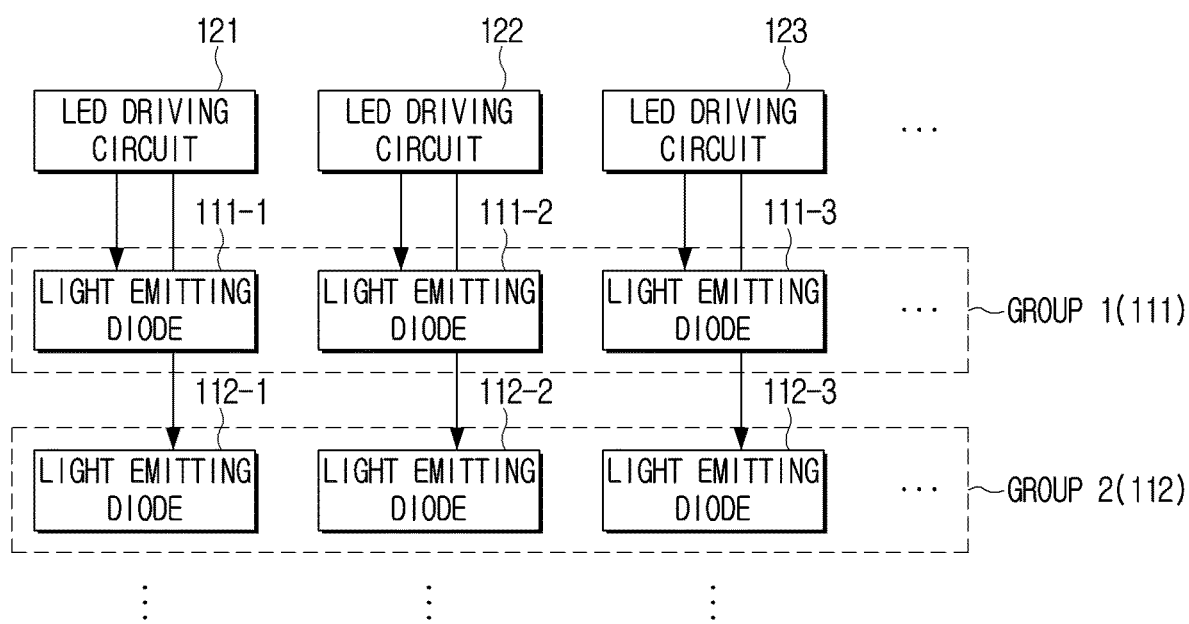
FIG. 1 is a block diagram illustrating a display panel according to an embodiment.

FIG. 1 is a block diagram illustrating a display panel according to an embodiment.

Referring to FIG. 1, a display panel 100 based on a light-emitting diode may include a plurality of light-emitting diodes 111-1, 111-2, 111-3, . . . , 112-1, 112-2, 112-3, . . . constituting a plurality of subpixels, and a plurality of LED driving circuits 121, 122, 123, etc.

Each of the plurality of LED driving circuits is a circuit for driving one or more light-emitting diodes. The plurality of LED driving circuits may be included in a circuit layer (e.g., Thin Film Transistor (TFT)) formed on a substrate of the display panel. In this case, the substrate may be implemented as, for example, glass.

Each of the light-emitting diodes may be an inorganic light-emitting diode constituting one sub-pixel.

For example, when the light-emitting diode is implemented as a micro LED, the light-emitting diode may constitute a sub-pixel that outputs any one of red, green, and blue light. In this case, the light-emitting diode corresponding to each of red, green, and blue may constitute one pixel. In other words, one pixel may be composed of a red micro LED that outputs red color light, a green micro LED that outputs green color light, and a blue green micro LED that outputs blue color light.

A micro light-emitting diode (micro-LED or μLED) display panel is one of flat panel display panels and is composed of a plurality of inorganic light-emitting diodes (inorganic LEDs), each measuring less than 100 micrometers. Compared to liquid crystal display (LCD) panels that require a backlight, micro LED display panels provide better contrast, response time and energy efficiency. Both organic LEDs and micro LEDs, which are inorganic light-emitting diodes, have good energy efficiency, but micro LEDs have a higher luminance, a better luminous efficiency, and a longer lifespan than OLEDs.

A TFT (or backplane) constituting a TFT layer of a micro LED in the disclosure is not limited to a particular structure or type. In other words, the TFT may be implemented as low-temperature polycrystalline silicon TFT (LTPS TFT), and oxide TFT, Si TFT (poly silicon, a-silicon), organic TFT, graphene TFT, etc., and may be implemented with only P type (or N-type) MOSFET generated in the silicon (Si) wafer CMOS process.

The display panel 100 may be composed of a plurality of pixels, and the plurality of pixels may be arranged on the display panel 100 in a matrix form. In this case, the number of pixels may be determined according to a predetermined resolution of the display panel.

For example, a display panel of a display apparatus displaying an 8K resolution of a 16:9 ratio consists of 7680×4320 pixels, and in the case of an inorganic light-emitting diode, one pixel comprises three LEDs, and thus 7680×4320×3 LED are required.

Referring to FIG. 1, the plurality of light-emitting diodes may be divided into a plurality of groups 111, 112, . . . . In this case, among the plurality of pixels arranged in a matrix form, light-emitting diodes constituting pixels located in the same row may be allocated into the same group (i.e. light-emitting diodes constituting pixels located in the same row may be in the same group). Alternatively, light-emitting diodes constituting pixels may be allocated into the same group in a checkerboard form (i.e., light-emitting diodes constituting pixels in a checkerboard form among a plurality of pixels arranged in a matrix form may be in the same group). This will be described below with reference to FIGS. 5A, 5B, 6A, 6B, or the like.

The plurality of LED driving circuits 121, 122, 123, . . . may receive a PWM data voltage in a scanning period. In this case, the PWM data voltage may be input from a driver.

The driver may input voltage/current or various data signals to the plurality of LED driving circuits according to a control of a processor or the like. The driver will be described below in more detail with reference to FIG. 8.

In addition, the plurality of LED driving circuits 121, 122, 123, . . . may provide driving currents to the plurality of light-emitting diodes for a time corresponding to an input PWM data voltage in an emission period (or light-emitting period) to drive the plurality of light-emitting diodes.

Referring to FIG. 1, each of the plurality of LED driving circuits may be connected to light-emitting diodes included in different groups among a plurality of groups. In addition, each of the plurality of LED driving circuits may drive the connected light-emitting diodes for each group.

Specifically, the plurality of LED driving circuits may drive light-emitting diodes included in each of the plurality of groups through a scanning period and an emission period for each of the plurality of groups, thereby dividing and driving the plurality of groups.

In this case, the plurality of LED driving circuits may time-divisionally drive the plurality of groups. In other words, the emission periods in which each of the plurality of groups is driven may be divided.

Specifically, an emission period of a second group among the plurality of groups may start after a point in time after an emission period of a first group among the plurality of groups ends. If the plurality of groups are composed of three or more groups, an emission period of a third group may start after the emission period of the second group ends. As such, each of the emission periods in which each of the plurality of groups is driven may not overlap with each other.

The LED driving circuit 121 may be connected to a light-emitting diode 111-1 included in the group 1 111 and a light-emitting diode 112-1 included in the group 2 112. Also, the LED driving circuit 121 may also be connected to light-emitting diodes belonging to groups 3 and 4 . . . . The LED driving circuit 121 may sequentially (time-division) drive the light-emitting diode 111-1 and the light-emitting diode 112-1.

The LED driving circuit 122 may be connected to the light-emitting diode 111-2 included in the group 1 111 and the light-emitting diode 112-2 included in the group 2 112. The LED driving circuit 122 may also be connected to light-emitting diodes belonging to groups 3 and 4 . . . . In addition, the LED driving circuit 122 may be driven by dividing the light-emitting diode 111-2 and the light-emitting diode 112-2, respectively.

In this case, while the LED driving circuit 121 drives the light-emitting diode 111-1 included in the group 1 111, the LED driving circuit 122 may also drive the light-emitting diode 111-2 included in the group 1 111.

In addition, while the LED driving circuit 121 drives the light-emitting diode 112-1 included in the group 2 112, the LED driving circuit 122 may also drive the light-emitting diode 112-2 included in the group 2 112.

Figure 2:
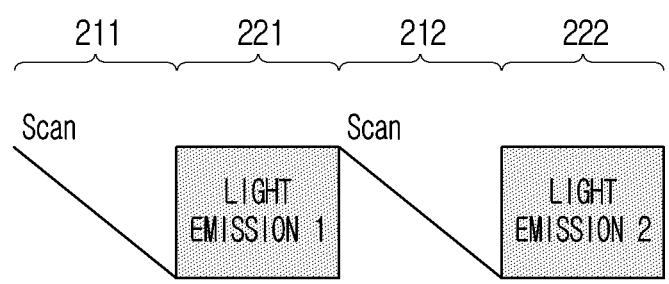
FIG. 2 is a graph illustrating a display panel for dividing light-emitting periods of light-emitting diodes into groups according to an embodiment.

FIG. 2 is a graph illustrating a display panel in which emission periods of light-emitting diodes are divided into groups according to an embodiment.

Referring to FIG. 2, according to a PWM driving method of the display panel 100, each of a plurality of LED driving circuits 121, 122, 123, . . . may receive a first PWM data voltage for driving the light-emitting diodes included in the first group 111 in a scanning period 211. In addition, the plurality of LED driving circuits 121, 122, 123, . . . may drive light-emitting diodes included in the first group 111 based on the first PWM data voltage in an emission period 221.

In addition, the plurality of LED driving circuits 121, 122, 123, . . . may receive a second PWM data voltage for driving the light-emitting diodes included in the second group 112 in a scanning period 212. The plurality of LED driving circuits 121, 122, 123, . . . may drive the light-emitting diodes included in the second group 111 based on the second PWM data voltage in an emission period 222.

FIG. 2 illustrates a case in which each of the plurality of LED driving circuits 121, 122, 123, . . . time-divisionally drives two groups, but it is also possible to time-divisionally drive three or more groups.

Figure 3A:
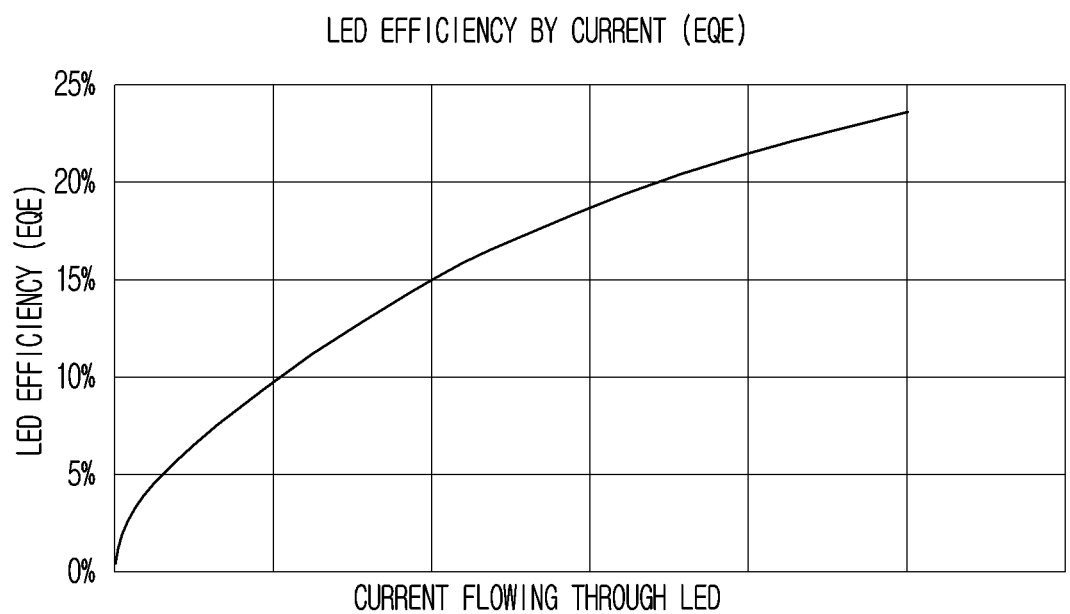
FIGS. 3A and 3B are graphs illustrating an effect of reducing power consumption of a display panel according to one or more embodiments.
Figure 3B:
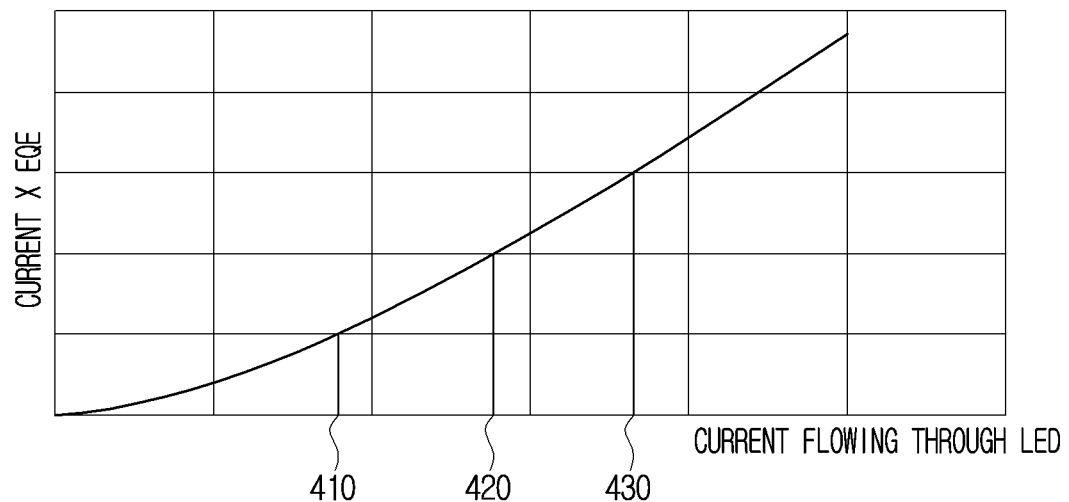

FIGS. 3A and 3B are graphs illustrating an effect of reducing power consumption of a display panel according to one or more embodiments.

Referring to FIG. 3A, as the current flowing through a light-emitting diode LED increases, the efficiency of the light-emitting diode LED also increases. In this case, the efficiency corresponds to a ratio of a luminance with respect to a consumed current.

Specifically, referring to FIG. 3B, the luminance of a light-emitting diode (LED) to which the current "420" is applied is twice the luminance of a light-emitting diode to which the current "410" is applied, however, the current flowing through an LED (i.e., the current "420") is less than two times the current "410". In other words, the luminance of the LED may be increased in two-folds without respectively increasing the current flowing through the LED by the same ratio of two-folds. In addition, the luminance of a light-emitting diode (LED) to which the current "430" is applied is three times the luminance of a light-emitting diode to which the current "410" is applied, but the current "430" is much less than three times the current "410". In other words, as the instantaneous luminance of the light-emitting diode increases, the current efficiency also increases.

In relation to FIG. 3, when the same grayscale is implemented, the display panel 100 may have less than half the driving time of each light-emitting diode compared to the conventional display panel, while maintaining the instantaneous luminance to be at least twice the luminance of the conventional display panel.

As shown in FIGS. 3A and 3B, the brighter the light-emitting diode is, the higher the current efficiency, therefore, the display apparatus including the light-emitting display panel 100 according to an embodiment may reduce instantaneous power consumption and average power consumption.

According to an embodiment for performing the above-described time-division driving, each LED driving circuit included in the display panel 100 may be connected to a plurality of transistors corresponding to each of a plurality of groups. In this case, each of the plurality of transistors may be implemented as an NMOSFET, a PMOSFET, or the like, but is not limited thereto.

Figure 4A:
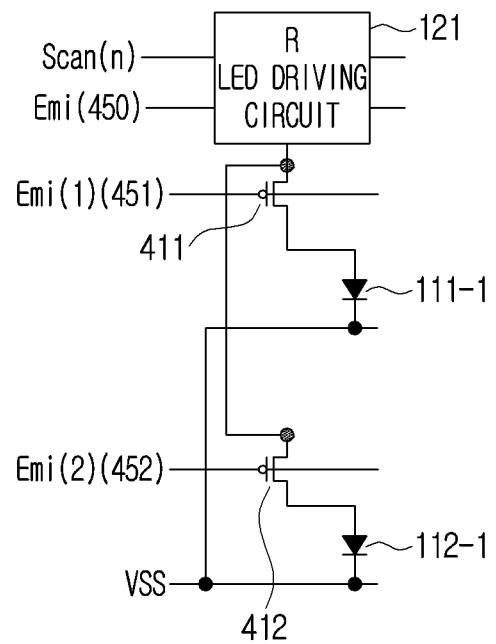
FIG. 4A is a circuit diagram illustrating a connection relationship between an LED driving circuit and light-emitting diodes in a display panel according to an embodiment.
Figure 4B:
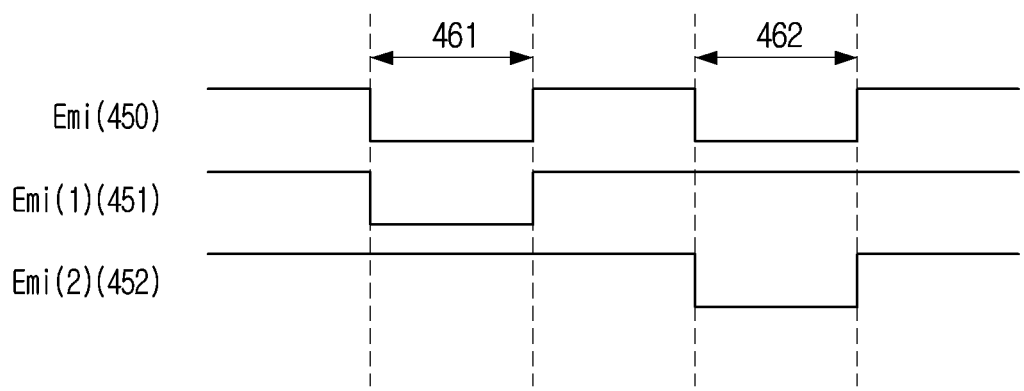
FIG. 4B is a graph illustrating waveforms of control signals respectively input to an LED driving circuit and a transistor in FIG. 4A according to an embodiment.

FIG. 4A is a circuit diagram illustrating a connection relationship between each of a plurality of LED driving circuits and light-emitting diodes included in a display panel according to an embodiment. FIG. 4B is a graph illustrating waveforms of control signals respectively input to the LED driving circuit and the transistor in FIG. 4A.

FIG. 4A illustrates a case in which the LED driving circuit 121 is connected to light-emitting diodes 111-1 and 112-1 constituting red sub-pixels included in two different pixels.

Referring to FIG. 4A, the LED driving circuit 121 may be connected to a first transistor 411 included in the group 1 111 which is connected to the light-emitting diode 111-1 driven by the LED driving circuit 121, and a second transistor 412 included in the group 2 112 which is connected to the light-emitting diode 112-1 driven by the LED driving circuit 121, or the like.

Referring to FIG. 4A, the LED driving circuit 121 may apply current to the first transistor 411 or the second transistor 412 according to a common control signal Emi 450.

Specifically, the LED driving circuit 121 may apply current to the first transistor 411 or the second transistor 412 during the emission period in which the common control signal Emi 450 is applied. The emission period may include both the emission period for group 1 (461 in FIG. 4B) and the emission period for group 2 (462 in FIG. 4B).

In this case, the first transistor 411 may be switched according to the first control signal Emi (1) 451, and the second transistor 412 may be switched according to the second control signal Emi (2) 452. The first control signal Emi (1) 451 may allow a current to be applied from the LED driving circuit 121 to the light-emitting diode 111-1 by turning on the first transistor 411 during the emission period 461 for the group 1 111. In addition, the second control signal EMI (2) 452 may allow a current to be applied from the LED driving circuit 121 to the light-emitting diode 112-1 by turning on the second transistor 412 during the emission period 462 for the group 2 112.

The LED driving circuit 121 may provide, based on a first PWM data voltage received in the scanning period for the group 1 111, a driving current to the light-emitting diode 111-1 included in the group 1 111 through the first transistor 411, which is turned on according to the first control signal Emi (1) during the emission period 461 for the group 1 111.

In addition, the LED driving circuit 121 may provide, based on the second PWM data voltage received in the scanning period for the group 2 112, a driving current to the light-emitting diode 112-1 included in the group 2 112 through the second transistor 412, which is turned on according to the second control signal Emi (2) during the emission period 462 for the group 1 112.

Referring to FIG. 4B, a common control signal (Emi 450) is applied to the LED driving circuit 121 for both the emission period 461 of the group 1 111 and the emission period 462 of the group 2 112. On the other hand, the first control signal Emi (1) 451 is input only during the emission period 461 of group 1 (111), and the second control signal Emi (2) 452 is input only during the emission period 462 of the group 2 112.

In this case, a sweep voltage for adjusting a time period for applying a current to the light-emitting diode according to the PWM data voltage may also be applied to the LED driving circuit 121 during the emission period of each group. This will be described in more detail with reference to FIG. 7.

Figure 5A:
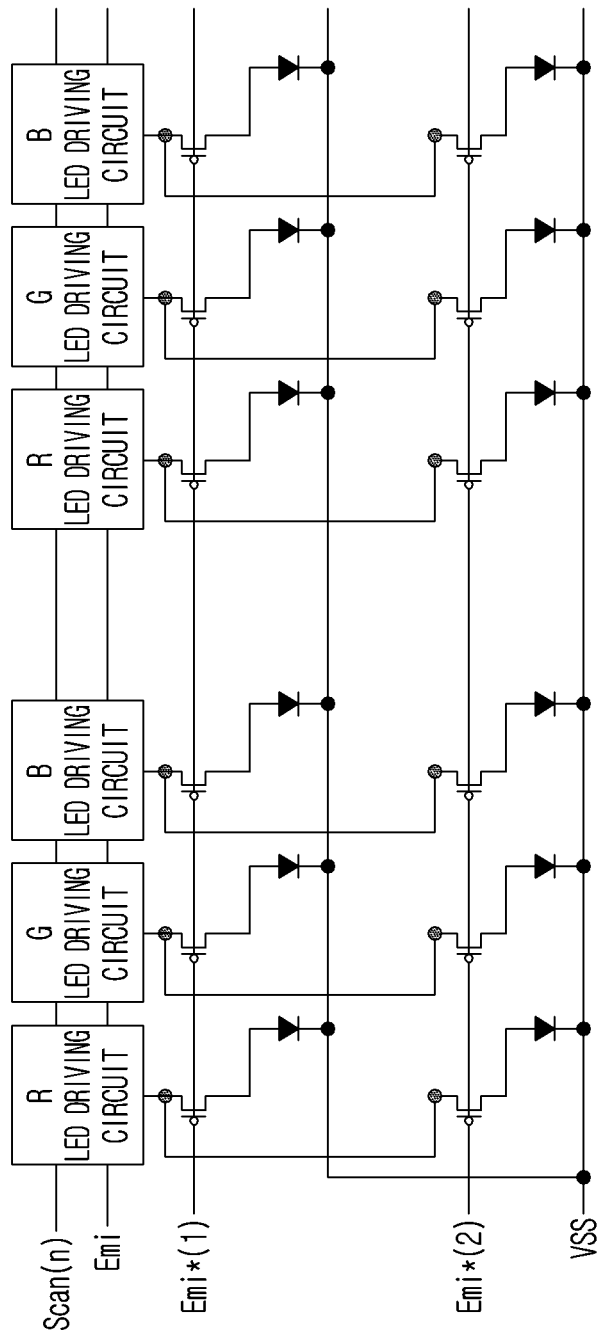
FIG. 5A is a circuit diagram illustrating a display panel including a plurality of LED driving circuits of FIG. 4A, and light-emitting diodes of the same row included in a same group according to an embodiment.

In the case of FIG. 5A, a current is selectively applied from an LED driving circuit to a light-emitting diode through a transistor, but various switching diodes or switching circuits that can be used instead of or in addition to the transistor.

FIG. 5A is a display panel including a plurality of LED driving circuits of FIG. 4A, and light-emitting diodes in the same row included in the same group according to an embodiment.

Referring to FIG. 5A, a first control signal Emi*(1) is respectively input to transistors connected to light-emitting diodes included in pixels of the first row, such that the light-emitting diodes of the first row (group 1) may be driven collectively. Also, the second control signal Emi*(2) is respectively input to transistors connected to light-emitting diodes included in pixels of the second row, such that the light-emitting diodes in the second row (group 2) may be collectively driven.

Although not illustrated in FIG. 5A, the display panel 100 may further include LED driving circuits connected to light-emitting diodes of the third row and light-emitting diodes of the fourth row, or the like. In addition, the LED driving circuits of FIG. 5A may be implemented to apply current to the light-emitting diodes in the third row in addition to the first row and the second row.

Figure 5B:
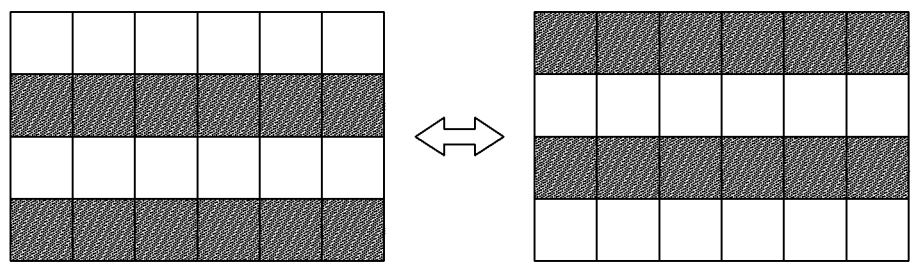
FIG. 5B is a view illustrating a display panel of FIG. 5A that is time-divided according to an embodiment.

Referring to FIG. 5A, if light-emitting diodes in odd-numbered rows are group 1 and light-emitting diodes in even-numbered rows are group 2, the display panel may time-divisionally drive the display panel as shown in FIG. 5B. That is, the odd-numbered rows and even-numbered rows of the display panel 100 may be time-divisionally driven.

However, in the case of FIG. 5B, the plurality of light-emitting diodes on the display panel 100 are divided into two groups, but they may be divided into three or more groups.

Figure 6A:
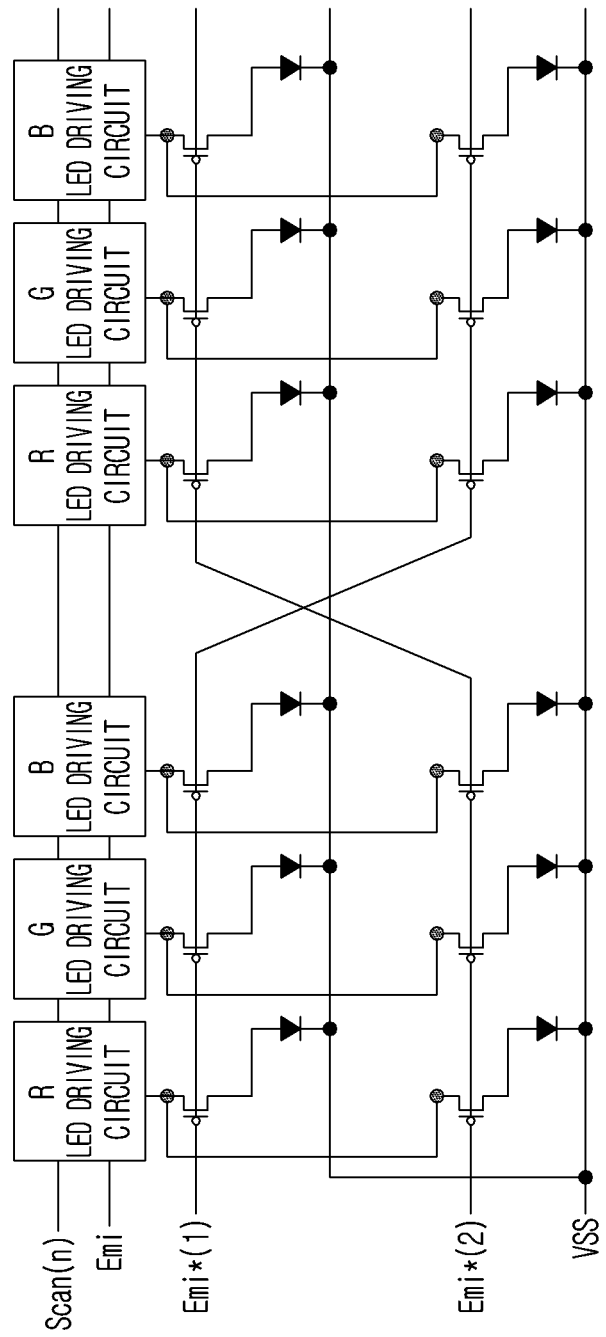
FIG. 6A is a circuit diagram illustrating a display panel including a plurality of LED driving circuits of FIG. 4A, and light-emitting diodes constituting a checkerboard form included in a same group according to an embodiment.

FIG. 6A is a circuit diagram illustrating a display panel including a plurality of LED driving circuits of FIG. 4A, and light-emitting diodes constituting a checkerboard form included in the same group according to an another embodiment.

In the case of FIG. 6A, a first control signal Emi*(1) may be input to transistors corresponding to the light-emitting diodes constituting a zigzag form among light-emitting diodes of the first row and the second row in the emission period for group 1. A second control signal Emi*(2) may be input to transistors to which the first control signal Emi*1 is not input among transistors corresponding to the light-emitting diodes of the first row and the second row in the emission period for group 2. That is, the first control signal Emi*(1) is input to some of the transistors connected to light emitting diodes included in the first row and some of the transistors connected to light emitting diodes included in the second row. The second control signal Emi*(2) is input to some of the transistors connected to light-emitting diodes included in the second row, to which the first control signal Emi*(1) is not applied. The second control signal Emi*(2) is also input to some of the transistors connected to light-emitting diodes included in the first row, to which the first control signal Emi*(1) is not applied.

Figure 6B:
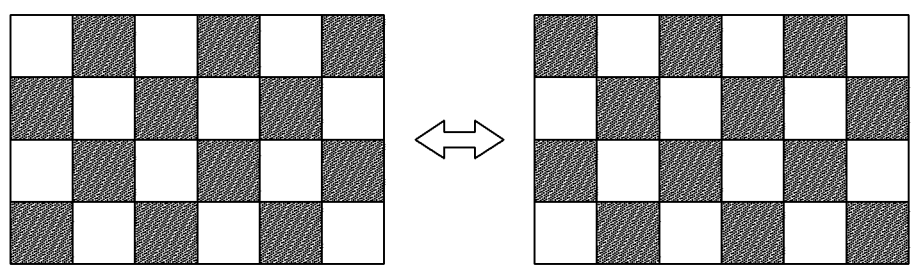
FIG. 6B is a view illustrating a display panel of FIG. 6A that is time-divided according to an embodiment.

As a result, the display panel 100 may time-divisionally drive in the form of a checker board as shown in FIG. 6B.

In the case of FIG. 5B, there may be unnecessary patterns such as lines, or the like, may be visible to the naked eye as a result of time-division driving of the plurality of light-emitting diodes for each row. However, the time-division driving of check board pattern in FIG. 6 may avoid the unnecessary patterns and may not be identifiable with the naked eyes.

However, the embodiments of dividing a plurality of light-emitting diodes in a matrix form into a plurality of groups and connecting them to a plurality of LED driving circuits and a plurality of transistors are not limited to the embodiments of FIGS. 5A to 5B and 6A to 6B described above, and it is possible to divide according to various shapes/patterns.

Figure 7:
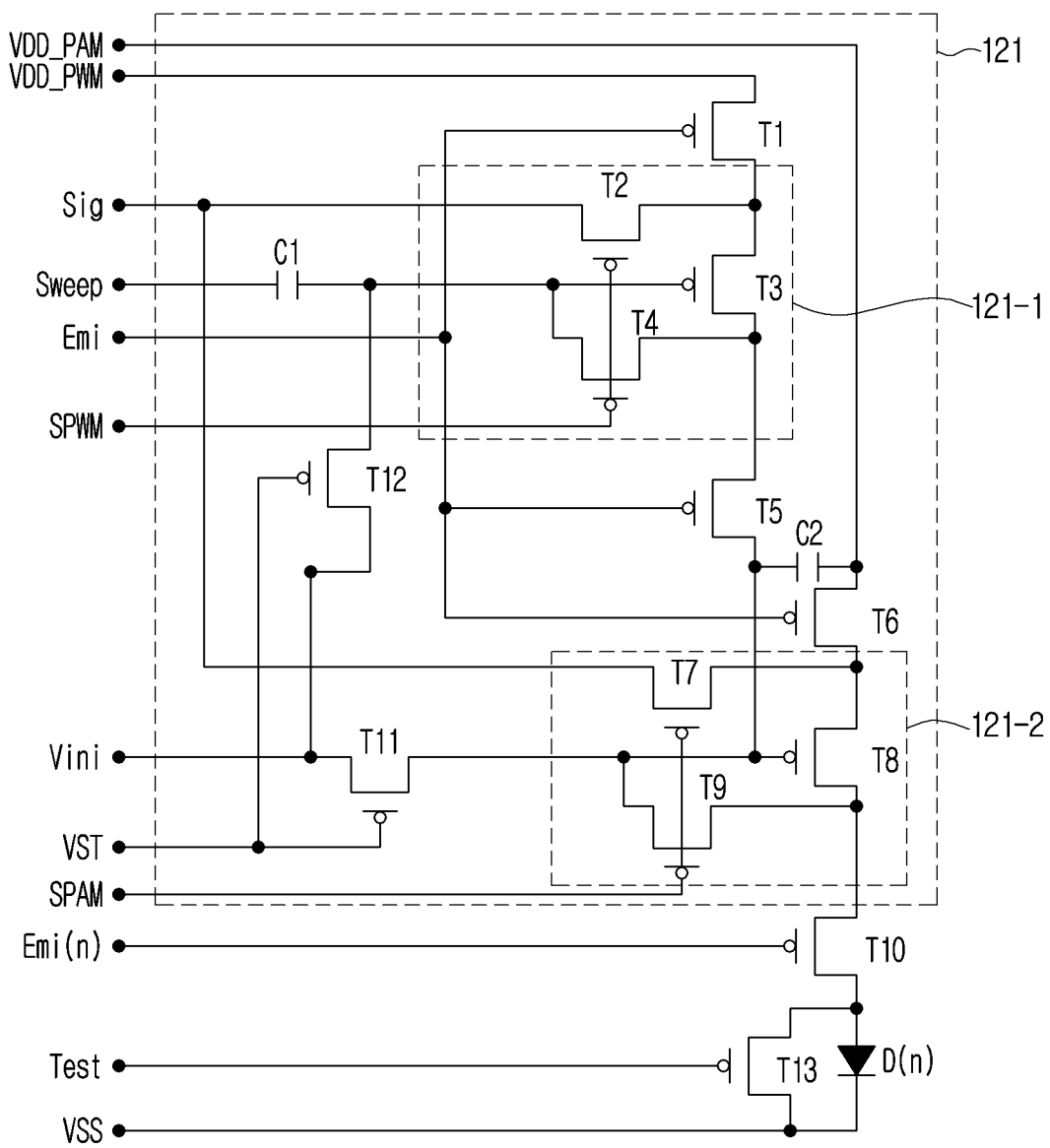
FIG. 7 is a circuit diagram illustrating an LED driving circuit included in a display panel according to an embodiment.

FIG. 7 is a circuit diagram illustrating an LED driving circuit included in a display panel according to an embodiment.

Referring to FIG. 7, a PAM data voltage is inputted to the LED driving circuit 121 through Sig. While transistors T9 and T7 are turned on according to a control signal SPAM, the PAM data voltage is applied to a source terminal of a transistor T8 through the transistor T7. In this case, due to a voltage difference between the source terminal and a gate terminal of the transistor T8, the transistor T8 is turned on. In this case, when the voltage difference between the source terminal and the gate terminal of the transistor T8 is smaller than a threshold voltage of the transistor T8, the transistor T8 is turned off. Therefore, a voltage equal to a sum of the PAM data voltage and the threshold voltage of a transistor T8 is applied to the gate terminal of the transistor T8 through the turned-on transistors T8 and T9.

Referring to FIG. 7, a PWM data voltage is inputted to the LED driving circuit 121 through Sig. While transistors T4 and T2 are turned on according to the control signal SPWM, the PWM data voltage is applied to a source terminal of a transistor T3 through the transistor T2. In this case, due to a voltage difference between the source terminal and a gate terminal of the transistor T3, the transistor T3 is turned on. In this case, when the voltage difference between the source terminal and the gate terminal of the transistor T3 is smaller than a threshold voltage of the transistor T3, the transistor T3 is turned off Therefore, a voltage equal to a sum of the PWM data voltage and the threshold voltage of a transistor T3 is applied to the gate terminal of a transistor T3 through the turned-on transistors T3 and T4.

A transistor T1 may be turned on/off according to a common control signal Emi to electrically connect or disconnect the power voltage VDD_PWM to the LED driving circuit 121.

Transistors T5 and T6 may be turned on/off according to the common control signal Emi to electrically connect or disconnect a PWM driving circuit 121-1 and a PAM driving circuit 121-2 of the LED driving circuit 121.

The PAM driving circuit 121-2 may control an amplitude of a driving current provided to a light-emitting diode D(n) based on the applied PAM data voltage, and the PWM driving circuit 121-1 may control a pulse width of the driving current provided to the light-emitting diode D(n) based on the applied PWM data voltage.

Transistors T11 and T12 may be turned on in response to a control signal VST, and apply an initial voltage Vini to a gate terminal of the transistor T8 and a gate terminal of the transistor T3.

An emission period may include a period during which at least one light-emitting diode emits light. During the emission period, the light-emitting diode may emit light according to the amplitude and pulse width of the driving current provided by the LED driving circuit 121, thereby expressing a grayscale corresponding to the applied PAM data voltage and the PWM data voltage.

Specifically, in a state in which a plurality of light-emitting diodes are divided into a plurality of groups, the transistors T1, T5, T6, and T10 are turned on according to the common control signal Emi during the emission period of each of the plurality of groups, a power voltage VDD_PAM may be applied to the light-emitting diodes (e.g., D(n)) among light-emitting diodes connected to the LED driving circuit 121 and included in different groups.

When the emission period starts, the power voltage VDD_PAM is transmitted to the light-emitting diode D(n) through the transistor T1, the transistor T6, the transistor T8, and the transistor T10, so that a voltage difference occurs at both ends of the light-emitting diode D(n) and light emission starts. In this case, the driving current that emits light of the light-emitting diode D(n) has an amplitude corresponding to the PAM data voltage.

Moreover, a sweep voltage Vsweep may be applied to a capacitor C1 in the emission period (by group) and may change linearly. For example, when the sweep voltage Vsweep is gradually reduced, a coupling voltage may be generated at a gate terminal of the transistor T3 in the floating state, through the capacitor C1.

Accordingly, a voltage of a gate terminal of the transistor T3 decreases according to a sweep voltage, and when the reduced voltage reaches a threshold voltage of the transistor T3, the transistor T3 may be turned on from an off state.

When the transistor T3 is turned on, the power voltage VDD_PWM is transmitted to the gate terminal of the transistor T8 through the transistor T1, the transistor T3, and the transistor T5. When the power voltage VDD_PWM is applied to the gate terminal of the transistor T8, the transistor T8 is turned off. When the transistor T8 is turned off, since the power voltage VDD_PWM does not reach the light-emitting diode D(n), the light-emitting diode D(n) does not emit light.

From the time when the power voltage VDD_PWM is applied to the light-emitting diode D(n) until the voltage applied to the gate terminal of the transistor T3 reaches a threshold voltage of the transistor T3 by changing the voltage applied to the gate terminal of the transistor T3 according to the sweep voltage Vsweep, a driving current is supplied to the light-emitting diode D(n). In other words, the driving current has a pulse width corresponding to the PWM data.

The transistor T10 may be turned on/off according to the control signal Emi(n) for a group n to which the light-emitting diode D(n) belongs, and electrically connect or disconnect the LED driving circuit 121 and the light-emitting diode D(n)). In other words, even if the common control signal Emi is input to the LED driving circuit 121, the light-emitting diode D(n) may emit light only when the control signal Emi(n) is input to the transistor T10.

The transistor T10 may correspond to one of the transistors 411 and 412 illustrated and described with reference to FIG. 4A.

The transistor T13 may be connected between an anode terminal and a cathode terminal of the light-emitting diode D(n). The transistor T13 may be turned on according to a control signal (Test) to check whether the LED driving circuit 121 is abnormal before the light-emitting diode D(n) is mounted on a TFT layer and electrically connected to the LED driving circuit 121, and may be turned on according to a control signal (discharging) to discharge charges remaining in the light-emitting element D(n) after the light-emitting element D(n) is mounted on the TFT layer and electrically connected to the LED driving circuit 121. In some embodiments, a circuit without the transistor T13 may also be implemented.

The cathode terminal of the light-emitting diode D(n) may be connected to a ground voltage VSS terminal.

In the case of FIG. 7, for convenience of description, only one transistor T10 and a light-emitting diode D(n) connected to the LED driving circuit 121 are illustrated, but as illustrated in FIG. 4A, the LED driving circuit 121 may be additionally connected to a separate light-emitting diode and a separate transistor included in a different group from the light-emitting diode D(n) shown in FIG. 7.

FIG. 7 is only illustrates one LED driving circuit among a plurality of LED driving circuits included in the display panel 100, and may be variously modified.

As a result of using an LED driving circuit that time-divisionally drives for light-emitting diodes belonging to different groups based on a circuit structure as illustrated in FIGS. 4A and 7, a current to be applied to the light-emitting diodes when implementing the same gradation may be decreased compared to that of the related art. As a result, a reference voltage (e.g., VDD-VSS setting) applied to the LED driving circuit and the light-emitting diode is reduced, such that instantaneous power and average power may be reduced.

In addition, since an LED driving circuit is not provided for each light-emitting diode as in the related art, and one LED driving circuit may drive two or more light-emitting diodes, there may be a greater spatial room in the circuit layer (TFT) of the display panel compared to that of the related art. In other words, it is possible to design a channel width of at least one of the transistor diodes included in the LED driving circuit to be larger than that of the conventional one, and as a result, the reference voltage required to apply the same current may be further reduced.

Figure 8:
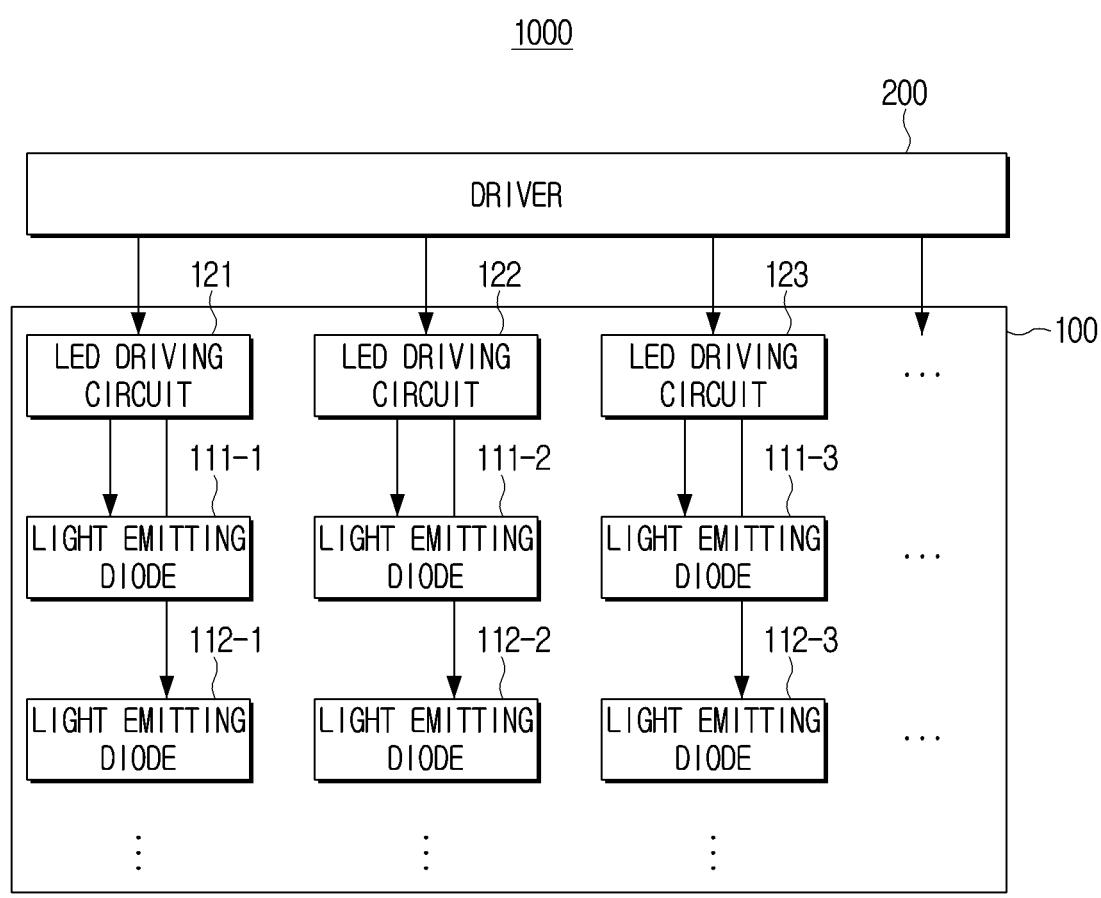
FIG. 8 is a block diagram illustrating a display apparatus including a display panel of FIG. 1 according to an embodiment.

FIG. 8 is a block diagram illustrating a display apparatus 1000 including the display panel 100 implemented as shown in FIG. 1 according to an embodiment. The display apparatus 1000 may correspond to a terminal device such as a TV, a monitor, a smartphone, a notebook PC, a tablet PC, a desktop PC, or the like, or a wearable device such as a smart watch, or the like, but is not limited thereto.

Referring to FIG. 8, the display apparatus 1000 further includes a driver 200 for driving the display panel 100 in addition to the display panel 100 according to the embodiments described above.

Specifically, the driver 200 may input various signals to a plurality of LED driving circuits 121, 122, 123, etc. included in the display panel 100.

For example, at least one of the above-described various signals input to the LED driving circuit 121 of FIG. 7 may be input from the driver 200. The driver 200 may be controlled through at least one processor included in the display apparatus 1000.

The driver 200 may include a timing controller, a data driver, and a gate driver.

The timing controller may receive an input signal (IS), a horizontal synchronization signal (Hsync), a vertical synchronization signal (Vsync), and a main clock signal (MCLK), from external sources. The timing controller may generate a video data signal, a scan control signal, a data control signal, a light emission control signal, and provide the generated signals to the display panel, the data driver, the gate driver, or the like.

In particular, the timing controller may apply at least one of various signals (Emi, Vsweep, Vini, VST, Test/Discharging) to the plurality of LED driving circuits 121, 122, 123, etc. In addition, the timing controller may apply a control signal (MUX Sel R, G, B) for selecting one of R, G, and B sub-pixels to the plurality of LED driving circuits 121, 122, 123, etc.

The data driver (or source driver, data driver) may be configured to generate a data signal, and receive image data of the R/G/B components, or the like from the processor to generate data voltage (e.g., PWM data voltage, PAM data voltage). Also, the data driver may apply the generated data signal to the LED driving circuit.

The gate driver (or gate driver) may be configured to generate various control signals such as a control signal SPWM(n), a control signal SPAM, or the like. The gate driver may input the generated control signals to the LED driving circuits corresponding to a specific row (or a specific horizontal line) among a plurality of pixels on the display panel 100, but is not limited thereto.

The gate driver may apply a driving voltage VDD to a driving voltage terminal of the LED driving circuit according to an embodiment.

The data driver and the gate driver may be included in a thin film transistor (TFT) layer formed on one surface of a glass of the display panel 100 in whole or in part, or may be implemented as a separate semiconductor IC and disposed on the other surface of the glass.

According to an embodiment, a display wall including a plurality of the display panels described above may also be implemented. On the display wall, emission periods for each group of the LED driving circuit included in one display panel may be designed not to be overlapped with emission periods for each group of the LED driving circuit included in to other display panel.

For example, a first display panel may drive light-emitting diodes of the first group and the second group, respectively, and the second display panel may drive light-emitting diodes of the third group and the fourth group, respectively.

In this case, after when the emission period of the first group included in the first display panel ends, the emission period of the third group included in the second display panel may start. In addition, after when the emission period of the third group included in the second display panel ends, the emission period of the second group included in the first display panel may start. In addition, after when the emission period of the second group included in the first display panel ends, the emission period of the fourth group included in the second display panel may start.

Figure 9:
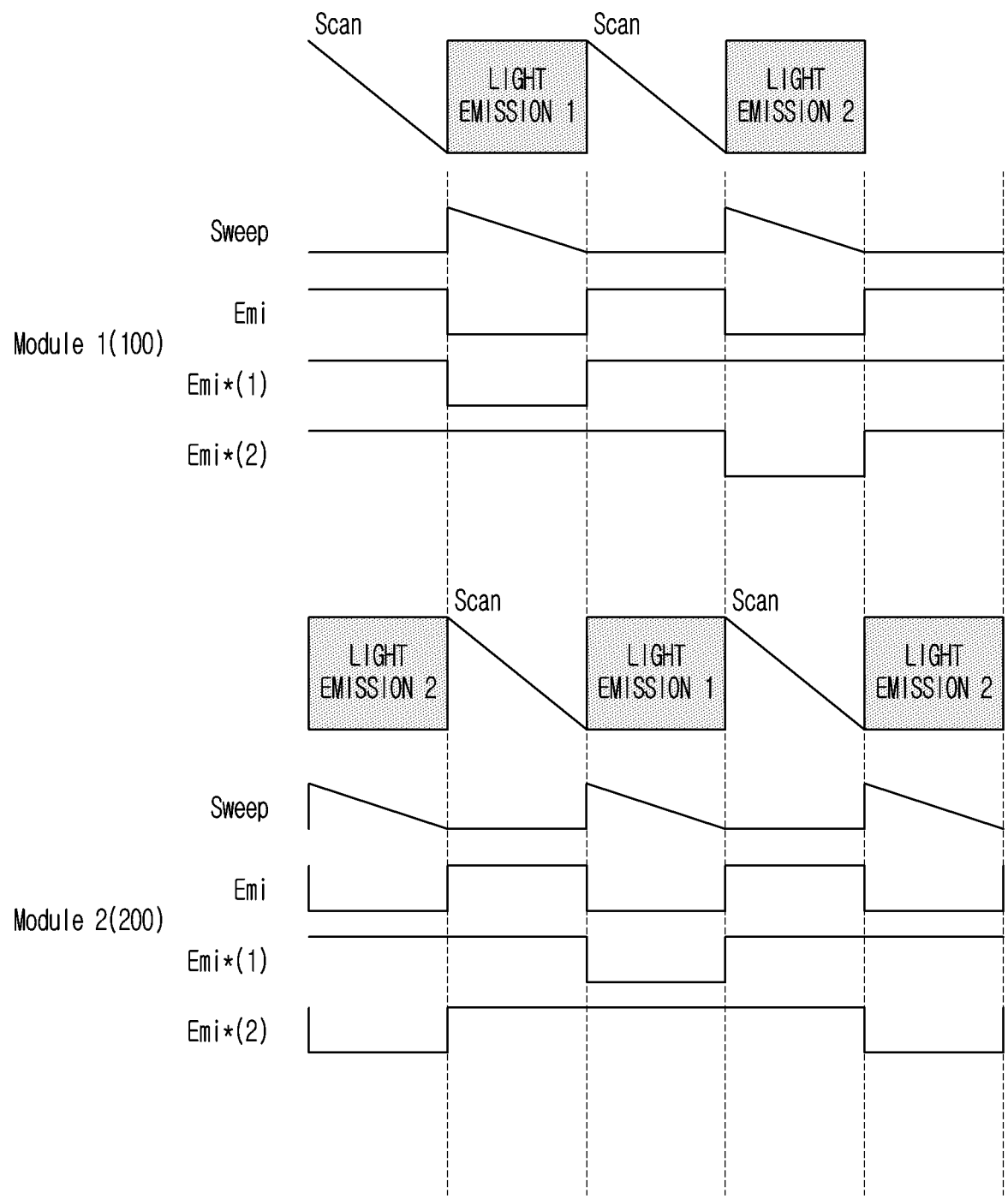
FIG. 9 is a graph of a display wall including a plurality of display panels of which emission periods do not overlap each other according to an embodiment.

FIG. 9 is a graph of a display wall including a plurality of display panels of which emission periods do not overlap each other according to an embodiment. FIG. 9 assumes a case in which each of the display panels included in the display wall time-divisionally drive light-emitting diodes by group as the embodiment described above.

Referring to FIG. 9, a scanning period and an emission period of a module 1 100 implemented as the display panel 100 and a module 2 200 implemented as the other display panel are shown through waveforms of signals.

Referring to FIG. 9, the emission periods for each group of module 1 100 may be separated from each other, and the emission periods for each group of module 2 200 may also be separated from each other. In addition, each of the emission periods for each group of the module 1 100 may be separated from each of the emission periods for each group of the module 2 200.

As such, the emission periods between the modules 100 and 200 may not overlap, and there is an effect of reducing instantaneous power and average power of the entire display wall.

Hereinafter, a method of operating a display panel according to an embodiment will be described.

Figure 10:
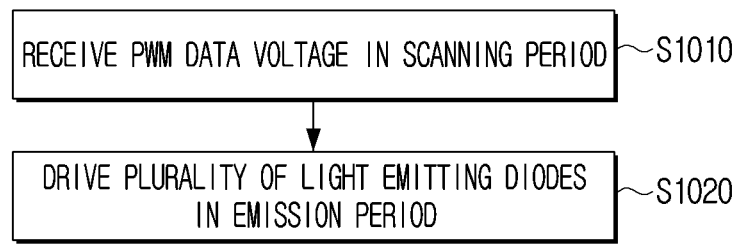
FIG. 10 is a flowchart illustrating a method of operating a display panel according to an embodiment.

FIG. 10 is a flowchart illustrating a method of operating a display panel according to an embodiment. In this case, the display panel includes a plurality of light-emitting diodes constituting a plurality of sub-pixels. Also, the plurality of light-emitting diodes are divided into a plurality of groups.

Referring to FIG. 10, in the method of operating, a plurality of LED driving circuits of the display panel may receive PWM data voltages in a scanning period (S1010).

In this case, each of the plurality of LED driving circuits may be connected to light-emitting diodes included in different groups among the plurality of groups.

Further, the plurality of LED driving circuits may drive the plurality of light-emitting diodes by providing driving currents to the plurality of light-emitting diodes for a time corresponding to the input PWM data voltage in the light-emitting period (S1020). In this case, through each of the plurality of LED driving circuits, the plurality of LED driving circuits may drive light-emitting diodes connected to each of the plurality of LED driving circuits for each group.

In other words, through the plurality of LED driving circuits, the plurality of groups may be divided and driven by driving the light-emitting diodes included in each of the plurality of groups through the scanning period and the emission period of each of the plurality of groups.

For example, through the plurality of LED driving circuits, the first PWM data voltage for the light-emitting diodes included in the first group may be received in the scanning period for the first group among the plurality of groups, and the light-emitting diodes included in the first group may be driven based on the first PWM data voltage input in the emission period for the first group. In addition, through the plurality of LED driving circuits, the second PWM data voltage for the light-emitting diodes included in the second group may be received in the scanning period for the second group among the plurality of groups, and the light-emitting diodes included in the second group may be driven based on the first PWM data voltage input in the emission period for the second group.

Each LED driving circuit may be connected to a plurality of transistors corresponding to each of the plurality of groups. In addition, the plurality of transistors may include a first transistor included in the first group and connected to the light-emitting diode driven by each LED driving circuit, and a second transistor included in the second group and connected to the light-emitting diode driven by each LED driving circuit.

The method of operating may include switching the first transistor according to the first control signal and switching the second transistor according to the second control signal.

Specifically, through each LED driving circuit, based on the first PWM data voltage received during the scanning period for the first group, the driving current may be provided to the light-emitting diodes included in the first group through the first transistor during the emission period for the first group. The first transistor may be turned on according to the first control signal. In addition, through each LED driving circuit, based on the second PWM data voltage received during the scanning period for the second group, the driving current may be provided to the light-emitting diodes included in the second group through the second transistor during the emission period for the second group. The second transistor may be turned on according to the second control signal.

The operation method described with reference to FIG. 10 may be performed by the display panel 100 illustrated and described with reference to FIG. 2.

The display module according to the disclosure may be installed and applied to an electronic product or an electric field which requires a wearable device, a portable device, a handheld device, and various displays as a single unit, and may be applied to a display device such as a monitor for a personal computer (PC), a high-resolution TV, signage, an electronic display, or the like, through a plurality of assembly arrangements as a matrix type.

Each component according to various embodiments described above may be composed of a singular entity or a plurality of entities, and some sub-components among the aforementioned sub-elements may be omitted, or other sub-components may be further included in various embodiments. Additionally, some components may be integrated into a single entity, and functions performed by each corresponding component prior to the integration may be performed identically or similarly.

Operations performed by a module, a program module, or other component, according to various example embodiments, may be executed sequentially, in parallel, iteratively, heuristically or a combination thereof, or at least some operations may be performed in a different order, omitted, or other operations may be added.

Although example embodiments of the disclosure have been illustrated and described, it should be understood that the disclosure is not limited to the embodiments described herein, and may be variously changed without departing from the spirit and the scope of the disclosure. Further, the embodiments according to the disclosure are not to limit the technical idea of the disclosure, but to describe, and the scope of the technical idea of the disclosure is not limited by these embodiments. Accordingly, the scope of protection of the disclosure should be interpreted by the following claims, and all technical ideas within the scope equivalent thereto should be construed as being included in the scope of the disclosure.

What is claimed is:

1. A display panel comprising:
   a plurality of light-emitting diodes constituting a plurality of sub-pixels of the display panel; and
   a plurality of light-emitting diode (LED) driving circuits configured to:
   receive a pulse width modulation (PWM) data voltage in a scanning period; and
   based on the PWM data voltage, drive the plurality of light-emitting diodes by providing drive current to the plurality of light-emitting diodes for a time corresponding to the PWM data voltage in an emission period,
   wherein the time corresponding to the PWM data voltage corresponds to a time period from a time when the drive current is supplied to a light-emitting diode to a time when a sweep voltage applied to a capacitor included in a light-emitting diode (LED) driving circuit reaches a threshold voltage,
   wherein the sweep voltage is a linearly decreasing voltage,
   wherein the plurality of light-emitting diodes are configured to be divided into a plurality of groups,
   wherein the plurality of groups include a first group having a first transistor and a second group having a second transistor, and
   wherein each of the plurality of LED driving circuits is configured to be connected to light-emitting diodes included in respective groups of the plurality of groups, drive the light-emitting diodes of the respective groups, turn on the first transistor in the first group according to a first control signal input during a first emission period of the first group and turn on the second transistor in the second group according to a second control signal input during a second emission period of the second group while a common control signal is applied to each of the plurality of LED driving circuits during both the first emission period and the second emission period.

2. The display panel of claim 1, wherein each of the plurality of LED driving circuits is configured to drive the respective groups of the plurality of groups by driving the light-emitting diodes included in the respective groups through a scanning period and an emission period associated with each of the plurality of groups.

3. The display panel of claim 2, wherein a first LED driving circuit among the plurality of LED driving circuits is configured to receive a first PWM data voltage for first light-emitting diodes included in a first group among the plurality of groups in a first scanning period associated with the first group, and drive the first light-emitting diodes included in the first group based on the first PWM data voltage in a first emission period associated with the first group, and
   wherein a second LED driving circuit among the plurality of LED driving circuits is configured to receive a second PWM data voltage for second light-emitting diodes included in a second group among the plurality of groups in a second scanning period associated with the second group, and drive the second light-emitting diodes included in the second group based on the second PWM data voltage in a second emission period associated with the second group.

4. The display panel of claim 3, wherein each of the plurality of LED driving circuits is configured to be connected to a plurality of transistors in the respective groups of the plurality of groups, and
   wherein the plurality of transistors comprise a first transistor included in the first group and connected to one of the first light-emitting diodes driven by the first LED driving circuit among the plurality of LED driving circuits and a second transistor included in the second group and connected to one of the second light-emitting diodes driven by the second LED driving circuit among the plurality of LED driving circuits.

5. The display panel of claim 4, wherein each of the plurality of LED driving circuits is configured to, based on the first PWM data voltage received in the first scanning period, turn on the first transistor according to a first control signal and provide the drive current to the first light-emitting diodes included in the first group through the first transistor during the first emission period, and
   wherein each of the plurality of LED driving circuits is configured to, based on the second PWM data voltage received in the second scanning period, turn on the second transistor according to a second control signal and provide the drive current to the second light-emitting diodes included in the second group through the second transistor during the second emission period.

6. The display panel of claim 1, wherein the plurality of light-emitting diodes are configured to constitute the plurality of sub-pixels of a plurality of pixels arranged in a matrix form on the display panel.

7. The display panel of claim 6, wherein the plurality of light-emitting diodes are grouped into a plurality of rows.

8. The display panel of claim 6, wherein the plurality of light-emitting diodes are grouped in a checkerboard form.

9. A method of operating a display panel including a plurality of light-emitting diodes constituting a plurality of sub-pixels, the method comprising:
   receiving, by a plurality of light emitting diode (LED) driving circuits, a pulse width modulation (PWM) data voltage in a scanning period; and
   based on the PWM data voltage, driving, by the plurality of LED driving circuits, the plurality of light-emitting diodes by providing drive current to the plurality of light-emitting diodes for a time corresponding to the PWM data voltage in an emission period;
   wherein the time corresponding to the PWM data voltage corresponds to a time period from a time when the drive current is supplied to a light-emitting diode to a time when a sweep voltage applied to a capacitor included in a light-emitting diode (LED) driving circuit reaches a threshold voltage, wherein the sweep voltage is a linearly decreasing voltage, wherein the plurality of light-emitting diodes are configured to be divided into a plurality of groups, wherein the plurality of groups include a first group having a first transistor and a second group having a second transistor, wherein the plurality of LED driving circuits are configured to be connected to light-emitting diodes included in respective groups of the plurality of groups, and drive the light-emitting diodes of the respective groups, and wherein the driving comprises turning on the first transistor in the first group according to a first control signal input during a first emission period of the first group and turning on the second transistor in the second group according to a second control signal input during a second emission period of the second group while a common control signal is applied to each of the plurality of LED driving circuits during both the first emission period and the second emission period.

10. The method of claim 9, wherein the driving further comprises driving the respective groups of the plurality of groups by driving the light-emitting diodes included the respective groups through a scanning period and an emission period associated with each of the plurality of groups.

11. The method of claim 10, wherein the driving further comprises receiving a first PWM data voltage for first light-emitting diodes included in a first group among the plurality of groups in a first scanning period associated with the first group, and driving the first light-emitting diodes included in the first group based on the first PWM data voltage in a first emission period associated with the first group, and receiving a second PWM data voltage for second light-emitting diodes included in a second group among the plurality of groups in a second scanning period associated with the second group, and driving the second light-emitting diodes included in the second group based on the second PWM data voltage in a second emission period associated with the second group.

12. The method of claim 11, wherein each of the plurality of LED driving circuits is configured to be connected to a plurality of transistors in the respective groups of the plurality of groups, and wherein the plurality of transistors comprise a first transistor included in the first group and connected to one of the first light-emitting diodes driven by a first LED driving circuit among the plurality of LED driving circuits, and a second transistor included in the second group and connected to one of the second light-emitting diodes driven by a second LED driving circuit among the plurality of LED driving circuits.

13. The method of claim 12, wherein the driving further comprises:

based on the first PWM data voltage received in the scanning period, turning on the first transistor according to a first control signal and providing the drive current to the first light-emitting diodes included in the first group through the first transistor during the first emission period, and based on the second PWM data voltage received in the second scanning period, turning on the second transistor according to a second control signal and providing the drive current to the second light-emitting diodes included in the second group through the second transistor during the second emission period.

* * * * *